United States Patent
May et al.

(10) Patent No.: US 11,239,752 B2
(45) Date of Patent: Feb. 1, 2022

(54) ADJUSTING PEAK INDUCTOR CURRENT TO LIMIT SUPPLY INPUT CURRENT

(71) Applicant: Cirrus Logic International Semiconductor Ltd., Edinburgh (GB)

(72) Inventors: Jeffrey Allen May, Dripping Springs, TX (US); Eric J. King, Dripping Springs, TX (US); Ku He, Austin, TX (US); Sarang Vadnerkar, Austin, TX (US); Ullas Pazhayaveetil, Cedar Park, TX (US); Theodore M. Burk, Cedar Park, TX (US)

(73) Assignee: Cirrus Logic, Inc., Austin, TX (US)

( * ) Notice: Subject to any disclaimer, the term of this patent is extended or adjusted under 35 U.S.C. 154(b) by 608 days.

(21) Appl. No.: 15/229,616

(22) Filed: Aug. 5, 2016

(65) Prior Publication Data

US 2017/0040895 A1 Feb. 9, 2017

Related U.S. Application Data

(60) Provisional application No. 62/202,295, filed on Aug. 7, 2015.

(51) Int. Cl.
*H02M 3/158* (2006.01)
*H02M 3/156* (2006.01)
(Continued)

(52) U.S. Cl.
CPC .......... *H02M 3/158* (2013.01); *G01R 19/165* (2013.01); *H02M 1/08* (2013.01); *H02M 1/32* (2013.01);
(Continued)

(58) Field of Classification Search
CPC .. H02M 1/08; H02M 1/32; H02M 2001/0003; H02M 3/156; H02M 3/157;
(Continued)

(56) References Cited

U.S. PATENT DOCUMENTS 6,215,288 B1 * 4/2001 Ramsey ............... H02M 3/1588
                                                  323/224
6,952,093 B1 * 10/2005 Broach ................ H02M 3/156
                                                  323/282
(Continued)

FOREIGN PATENT DOCUMENTS

CN          104038048 A      9/2014
EP            1798852 A2     6/2007

OTHER PUBLICATIONS

International Search Report and Written Opinion of the International Search Authority, International Application No. PCT/US2016/061304, dated Jan. 31, 2017.

(Continued)

*Primary Examiner* — Thienvu V Tran
*Assistant Examiner* — Shahzeb K Ahmad
(74) *Attorney, Agent, or Firm* — Jackson Walker L.L.P.

(57) ABSTRACT

A method may include monitoring an input power supply, monitoring an inductance of an inductor of a boost converter, monitoring one or more other characteristics of the boost converter, and calculating a target peak inductor current based on the input power supply voltage, the inductance, the one or more other characteristics of the boost converter, and a target average current of the inductor during a switching cycle of the boost converter. A method may include monitoring an input power supply voltage, monitoring an inductance of an inductor of a boost converter, monitoring one or more other characteristics of the boost converter, and calculating an average current of the inductor during a switching cycle of the boost converter based on the input power supply voltage, the inductance, the one or more other characteristics of the boost converter, and a peak inductor current of the inductor.

38 Claims, 6 Drawing Sheets

(51) Int. Cl.
    *G01R 19/165*         (2006.01)
    *H02M 1/08*           (2006.01)
    *H02M 1/32*           (2007.01)
    *H02M 1/00*           (2006.01)

(52) U.S. Cl.
    CPC .......... *H02M 3/156* (2013.01); *H02M 1/0009* (2021.05)

(58) Field of Classification Search
    CPC ......... H02M 2001/0009; H02M 3/158; H02M 3/1588; H02M 1/0009; G01R 19/165
    See application file for complete search history.

(56) References Cited

U.S. PATENT DOCUMENTS

| | | | |
|---|---|---|---|
| 9,391,517 | B1 | 7/2016 | Pazhayaveetil et al. |
| 2004/0222846 | A1 | 11/2004 | Melanson et al. |
| 2005/0100179 | A1 | 5/2005 | Behboodian et al. |
| 2012/0177226 | A1 | 7/2012 | Silverstein et al. |
| 2013/0207628 | A1* | 8/2013 | Chen ..................... H02M 3/156 323/271 |
| 2014/0117960 | A1 | 5/2014 | Boling |
| 2014/0247029 | A1* | 9/2014 | Krabbenborg ...... H03F 3/45179 323/282 |
| 2015/0030183 | A1 | 1/2015 | Pazhayaveetil et al. |
| 2015/0032396 | A1 | 1/2015 | Pazhayaveetil et al. |
| 2015/0229202 | A1* | 8/2015 | Varigonda ............... H02M 1/32 323/282 |
| 2015/0381032 | A1* | 12/2015 | Li .......................... H02M 1/36 323/271 |
| 2017/0142518 | A1 | 5/2017 | May et al. |

OTHER PUBLICATIONS

International Application No. PCT/US2016/045818, International Search Report and Written Opinion of the International Search Authority, dated Nov. 7, 2016, 12 pages.

First Examination Opinion Notice, State Intellectual Property Office of the People's Republic of China, Application No. 201680058520.5, dated Sep. 5, 2019.

Third Examination Opinion Notice, State Intellectual Property Office of the People's Republic of China, Application No. 201680058520.5, dated Jul. 17, 2020.

Notice of Preliminary Rejection, Korean Intellectual Property Office, Application No. 10-2018-7006694, dated Oct. 22, 2021.

* cited by examiner

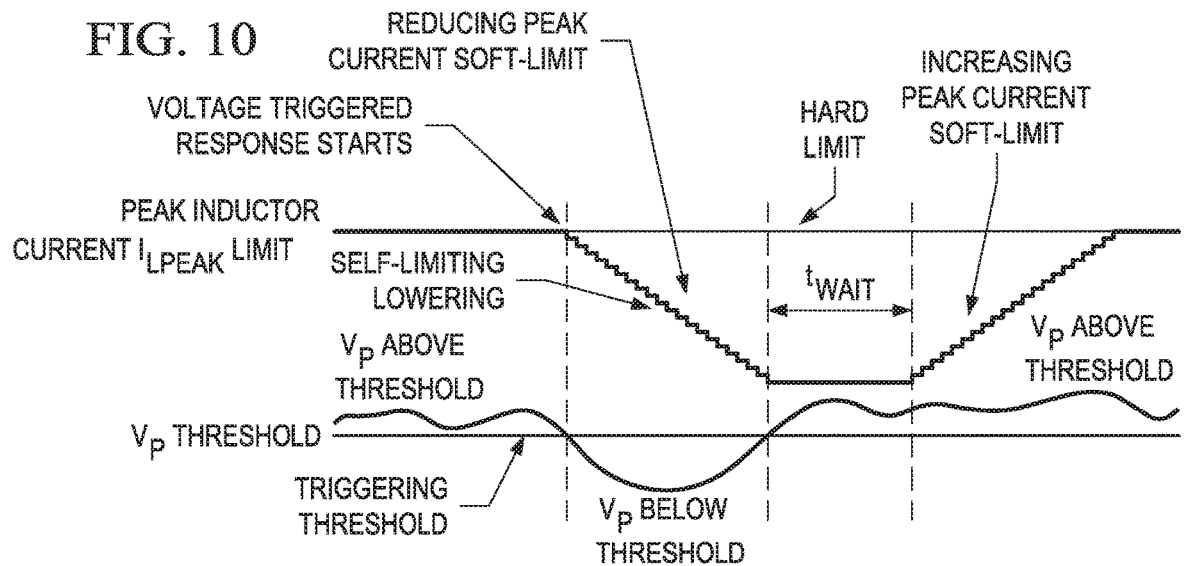
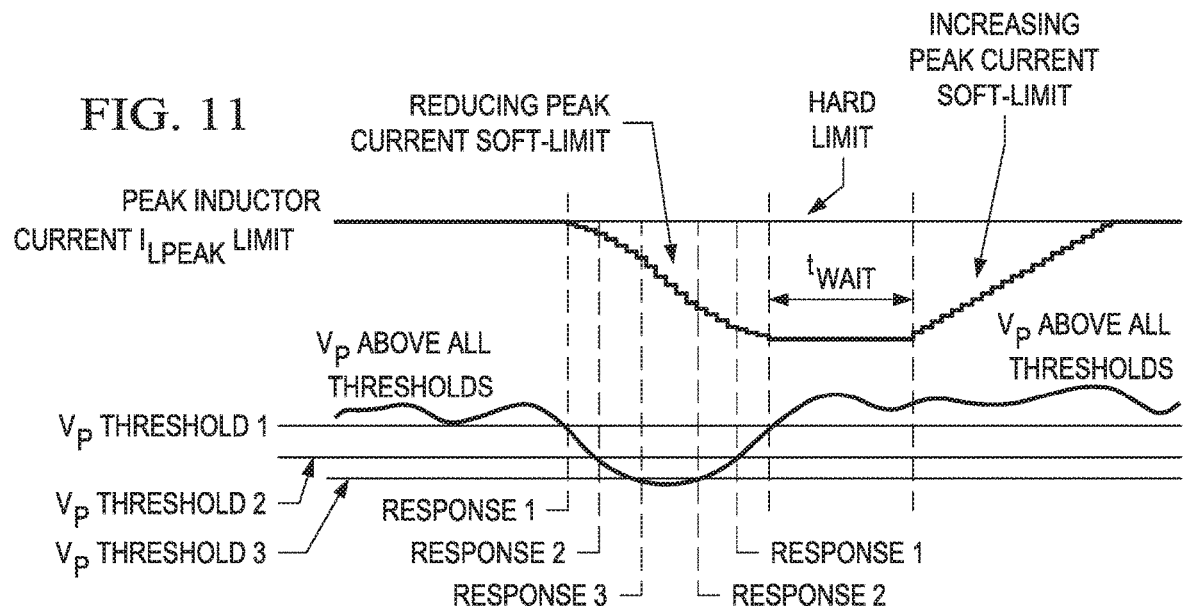

ADJUSTING PEAK INDUCTOR CURRENT TO LIMIT SUPPLY INPUT CURRENT

RELATED APPLICATION

The present disclosure claims priority to U.S. Provisional Patent Application Ser. No. 62/202,295, filed Aug. 7, 2015, which is incorporated by reference herein in its entirety.

FIELD OF DISCLOSURE

The present disclosure relates in general to circuits concerning or relating to dynamically limiting the peak current consumption of a switching direct-current to direct-current (DC-DC) boost converter based on power supply conditions, triggering various user configurable or dynamic thresholds which result in a managed change of the switching converter's peak current limiting with the purpose of dynamically restricting peak power supply consumption from the boost converter's supply. Applications may include, but are not limited to, cell phones, media players, tablets, laptops, other portable battery powered devices, and other devices, that use audio amplifiers, boosted audio amplifiers, or other amplifier devices that can produce a large dynamic load on the battery, causing either a system overload or large voltage supply drop on the battery. The actual loading and demands on the supply can vary based on the end-user selected content, such as voice or audio playback.

BACKGROUND

Portable devices are becoming more common in every aspect of our lives and affect how we interact with our music. For example, many consumers listen to their music from portable audio players, such as MP3 players or their cellular phones. These portable devices become easier and more enjoyable to use when the portable devices shrink in size while offering the same capabilities and when the portable devices can last longer from a single battery charge. To support longer lasting devices, the operating voltage of the components inside the portable device is often reduced to reduce power consumption by these components. However, a reduction in operating voltage affects the sound output of the portable device, because the volume level of an audio signal output to a speaker is proportional to the output voltage. Thus, boost converters have been used to increase operating voltages for select components within a portable device that benefit from higher voltages, such as the audio amplifier that needs high voltages to generate high volumes.

FIG. 1 illustrates an example audio amplifier 1 with a boost converter, as is known in the relevant art. Audio amplifier 1 may include a battery supply 2 that provides a voltage, $V_P$, to a boost converter 4. Boost converter 4 may increase the voltage $V_P$ to a boost voltage, $V_{BST}$. A speaker amplifier 8 may receive the boost voltage $V_{BST}$, and an analog audio signal, SIG, from a digital-to-analog converter (DAC) 6. Speaker amplifier 8 may increase the low power signal of audio signal SIG with power received from the boost converter 4 to generate a signal to drive a speaker 10. Boost voltage $V_{BST}$ may be higher than supply voltage $V_P$ which may allow speaker amplifier 8 to provide louder volume ranges through speaker 10 than possible with only supply voltage $V_P$.

In battery powered devices, the amount of peak available power can vary based on the operational state of the battery. If the battery or voltage power supply is in a low charge state, its ability to provide current or maintain an output voltage is typically reduced from when it is operating in a full-charge state. On systems having audio amplifiers supplied by boost converters, the boost converter's output power to the audio amplifier may determine how much power can be delivered to the load and therefore how much acoustic energy (loudness) can be produced from the speaker load.

In the example, boosted amplifier 1 shown in FIG. 1, when the peak inductor current through boost converter 4 is limited, both the maximum input power consumption of the system and the maximum output power that can be delivered to amplifier 8 and through the load (e.g., speaker 10) are, in turn, also limited.

In general, batteries can supply a finite amount of output current. In complex portable devices, such as cellular phones, media players, tablets, laptops, etc., this current budget is shared among multiple end product subsystems (e.g., applications, processor, LCD screen, cellular radio, etc.). In order to meet the market's demands for higher audio loudness from these portable devices, the boosted audio amplifier can consume large peaks of energy from the battery supply. The existence of a boost converter allows more power to be driven from the amplifier to the load but at the expense of more power consumption. This tradeoff means that the boosted amplifier device must be able to limit and manage its maximum power consumption from the battery supply appropriately in order to operate properly within the limits of the battery's capabilities and co-exist with other end product subsystems, while not producing a low voltage "brownout" event on the portable device.

Boost converters in these types of systems often have peak inductor current limiters in order to restrict current consumption through an inductor and a switch (e.g., a field-effect transistor or "FET") of the boost converter. The inductor's peak current limit may be leveraged to a certain extent to restrict input power to the boost converter. However, such limiting is typically performed in a very static manner, and the system does not take into account changes in battery supply voltage or inductance. Thus, the relationship between peak inductor current and battery supply current consumption may vary, reducing the ability of accurately managing battery supply current consumption through a peak inductor current limit.

For example, if the boosted amplifier's peak inductor current limit is statically configured to limit power consumption for purposes of preventing the boosted amplifier from overloading the battery when in a low voltage or weakened state of operation, it cannot fully utilize the additional available power from the battery when it is more fully charged. Configuring a peak inductor current limit in this manner produces an overly conservative power consumption limitation for most of the battery's operational life in order to provide protection for a worst case operating condition. The conservative configuration restricts power delivery from the boost converter to the amplifier and to the load (speaker), translating into a restricting output power to the speaker.

Conversely, if the boosted amplifier's peak inductor current is configured more aggressively to take advantage of the power available when the battery is fully charged, the system then risks overloading the supply once the battery has discharged. This more aggressive configuration of the inductor current can cause a low supply voltage event that can cause the device to self-reset or "brownout." This self-reset or "brownout" event is both displeasing to the user of the portable device and can be problematic for the device producer.

In order to protect against a worst case condition and still allow for utilization of the additional battery supply power when available, the power consumption limiting must dynamically adapt to the battery supply and operational conditions of the boosted amplifier.

FIG. 2A illustrates example audio amplifier 1 of FIG. 1 and various parasitic or intrinsic impedances associated with components of example audio amplifier 1, as is known in the relevant art. In operation, as shown in FIG. 2B, most of the switching peak-to-peak ripple inductor current $I_L$ through an inductor 12 of boost converter 4 may be filtered by a local capacitance $C_{VP}$ of battery supply 2 and any series impedance $Z_{VP}$ in battery supply 2 itself or in a connection between battery supply 2 and an input of boost converter 4. A current $I_P$ as seen by battery supply 2 and supplied to audio amplifier 1 may typically be much lower in frequency than inductor current $I_L$.

A number of methods and systems for monitoring, managing conditions, and/or improving amplification of a boost converter generally exist.

As a first example, U.S. Patent Publication No. 20150030183 filed on Feb. 18, 2014, entitled "Boost Converter Voltage Controlled Based on Audio Signal," and assigned to Cirrus Logic, Inc., which is incorporated by reference herein, discloses a way for "audio amplification to be improved by controlling an audio amplifier based on the audio signal being amplified. For instance, when the audio signal level increases or decreases, a boost voltage provided to an audio amplifier by a boost converter may also be increased or decreased. As another instance, when the audio signal level decreases below a certain level, the audio amplifier may be switched from amplifying the audio signal with a boost converter input to amplifying the audio signal with a low voltage input. Control of the audio amplifier may be implemented in a digital boost converter controller coupled to the boost converter and/or the audio amplifier."

As a second example, U.S. Patent Publication No. 20150032396 filed on Feb. 18, 2014, entitled "Boost Converter Controller with Inductance Value Determination," and assigned to Cirrus Logic, Inc., which is incorporated by reference herein, discloses "a controller of a boost converter [that] may be configured to dynamically adjust conditions within the boost converter by monitoring conditions in the boost converter. For instance, the controller may determine a current inductance value for an inductor of the boost converter by monitoring a current through the inductor. When the inductance value of the inductor is known, a slope compensation value may be used in determining a transition time between charging the inductor of the boost converter and discharging the inductor."

As a third example, U.S. Ser. No. 14/182,939 filed on Feb. 18, 2014, entitled "Determination of Inductor Current During Reverse Current in a Boost Converter," and assigned to Cirrus Logic, Inc., which is incorporated by reference herein, discloses that "during operation of a boost converter, conditions may exist that result in a reverse current through the boost converter, such as when a load drop from the boost converter occurs. During the reverse current period, inductance value determinations made during a forward current period may be used to estimate a magnitude of the reverse current, and this estimate is used by a controller to control the boost converter and return the boost converter to normal operation. The controller may control the boost converter by changing a ratio of charging and discharging time for an inductor of the boost converter, decreasing a bandwidth of the boost converter, and/or increasing a resistance of the boost converter."

As a fourth example, U.S. Pat. No. 9,391,517 filed on Feb. 18, 2014, entitled "Controller for Adjusting a Switching Frequency in a Boost Converter," and assigned to Cirrus Logic, Inc., which is incorporated by reference herein, discloses that "thermal levels in an inductor of a boost converter may be managed by controlling an average current through the inductor. For example, a switching frequency of the boost converter between charging and discharging the inductor may be increased or decreased. Increasing or decreasing the switching frequency results in a corresponding decrease or increase in the switching period for the boost converter. The controller may adjust the switching frequency to control the average current level while maintaining a peak-to-peak current level in the inductor by monitoring the inductance of the inductor and the peak current level in the inductor."

As a fifth example, U.S. Ser. No. 14/183,096 filed on Feb. 18, 2014, entitled "Controller for Imposing Current Limits on a Boost Converter for Managing Thermal Loads," and assigned to Cirrus Logic, Inc., which is incorporated by reference herein, discloses "thermal levels in an inductor of a boost converter being managed by implementing peak current limits for the boost converter. For example, an inductor may be allowed to conduct a certain peak current limit for a certain period of time before the current is reduced by a controller to a low current limit. The controller may hold the low current limit in place for a certain period of time, after which the current through the inductor is allowed to again exceed the low current limit. However, if the high current limit is again exceeded or sustained for a certain period of time, the low current limit may be again imposed by the controller. In this fifth example, the digitally regulated peak current mode controlled boost converter with peak current hard-limit and soft-limit leverages a fixed hard-limit, with a dynamic soft limit specifically for purposes of protecting an inductor from failure mechanisms, such as thermal overheating."

SUMMARY

In accordance with the teachings of the present disclosure, one or more disadvantages and problems associated with existing approaches to controlling current consumption in a power converter may be reduced or eliminated.

In accordance with embodiments of the present disclosure, a method may include monitoring an input power supply voltage of a power supply, monitoring an inductance of an inductor of a boost converter comprising the inductor, monitoring one or more other characteristics of the boost converter, and calculating a target peak inductor current based on the input power supply voltage, the inductance, the one or more other characteristics of the boost converter, and a target average current of the inductor during a switching cycle of the boost converter.

In accordance with these and other embodiments of the present disclosure, an apparatus may include a boost converter having a power supply input for receiving an input power supply voltage of a power supply, an inductor, and an output for generating an output voltage greater than the input power supply voltage and a controller configured to monitor the input power supply voltage, monitor the inductance of the inductor, monitor one or more other characteristics of the boost converter, and calculate a target peak inductor current based on the input power supply voltage, the inductance, the one or more other characteristics of the boost converter, and a target average current of the inductor during a switching cycle of the boost converter.

In accordance with these and other embodiments of the present disclosure, a method may include monitoring an input power supply voltage of a power supply, monitoring an inductance of an inductor of a boost converter comprising the inductor, monitoring one or more other characteristics of the boost converter, and calculating an average current of the inductor during a switching cycle of the boost converter based on the input power supply voltage, the inductance, the one or more other characteristics of the boost converter, and a peak inductor current of the inductor.

In accordance with these and other embodiments of the present disclosure, an apparatus may include a boost converter having a power supply input for receiving an input power supply voltage of a power supply, an inductor, and an output for generating an output voltage greater than the input power supply voltage, and a controller configured to monitor the input power supply voltage, monitor the inductance of the inductor, monitor one or more other characteristics of the boost converter, and calculate an average current of the inductor during a switching cycle of the boost converter based on the input power supply voltage, the inductance, the one or more other characteristics of the boost converter, and a peak inductor current of the inductor.

Technical advantages of the present disclosure may be readily apparent to one of ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the example, present embodiments and certain advantages thereof may be acquired by referring to the following description taken in conjunction with the accompanying drawings, in which like reference numbers indicate like features, and wherein:

FIG. 10 depicts a graph of a peak inductor current limit and a supply voltage over time to illustrate an example implementation in which a peak current soft-limit is continually reduced until the supply voltage has returned above an initial triggering threshold of a peak inductor current limiting time-based response, in accordance with embodiments of the present disclosure; and FIG. 11 depicts a graph of a peak inductor current limit and a supply voltage over time to illustrate an example implementation utilizing a multi-threshold response wherein as the supply voltage decreases below each threshold, a different response rate is applied for each threshold, in accordance with embodiments of the present disclosure.

DETAILED DESCRIPTION

Figure 1:
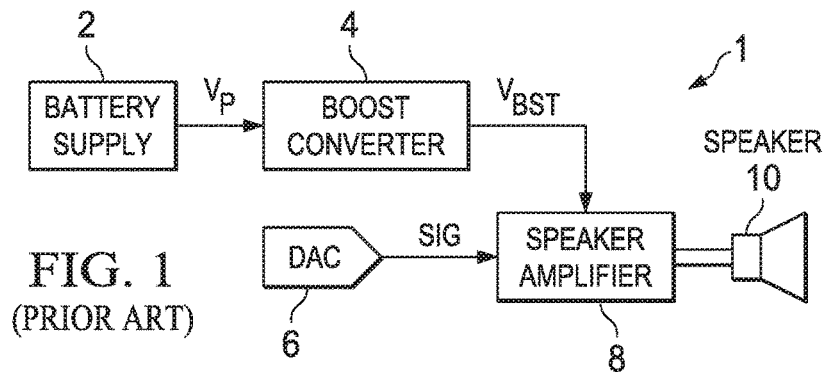
FIG. 1 illustrates an example audio amplifier with a boost converter, as is known in the relevant art.
Figure 2A:
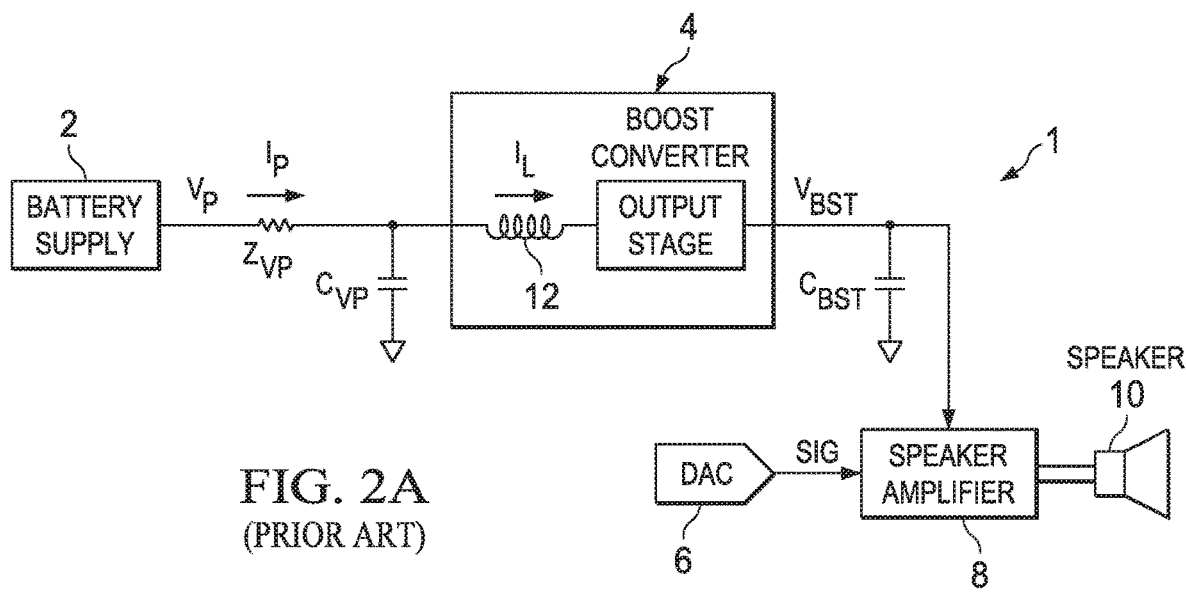
FIG. 2A illustrates the example audio amplifier of FIG. 1 with various parasitic or intrinsic impedances associated with components of the example audio amplifier, as is known in the relevant art.
Figure 2B:
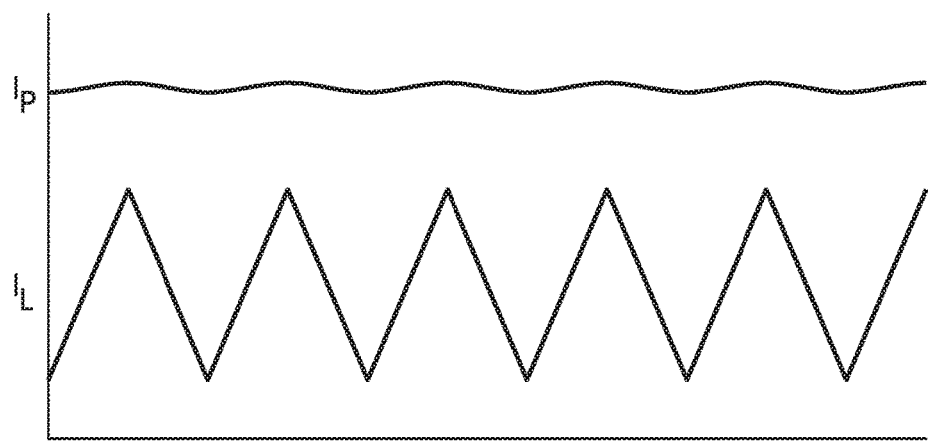
FIG. 2B illustrates an example graph of a power supply current $I_P$ and an inductor current $I_L$ versus time within the audio amplifier of FIG. 1, as is known in the relevant art.

In accordance with embodiments of the present disclosure, systems and methods may be provided for dynamically adapting a peak inductor current of a boosted amplifier in order to manage supply power current consumption. By dynamically adapting the peak inductor current of a boosted amplifier, a supply current provided to the boosted amplifier from a power supply (e.g., battery supply) may be managed, thus allowing the boosted amplifier to adapt to maximize delivery power to the load when the system allows for it while still appropriately limiting input power consumption when the power supply is less capable of supplying power to a system comprising the boosted amplifier. It may also allow for the leveraging of a peak current control mechanism that already commonly exists within traditional boost converters. The dynamic peak current control disclosed herein may leverage a concept of applying a hard limit to peak inductor current and a dynamically variable soft limit lesser than the hard limit in order to adapt peak inductor current in accordance with system parameters and operating conditions. However, in the present disclosure, such dynamic peak current control may not serve the purpose of protecting the inductor, but rather may be used in order to restrict maximum input power consumption of the boosted amplifier based on system level operating conditions. Thus, a peak inductor current hard limit may be increased to utilize additional power from the power supply when available, and the peak inductor current soft limit may dynamically adapt based on system conditions in order to prevent power supply overload as a battery discharges and weakens, preventing an overload, power supply voltage droop, or brownout condition.

The dynamic peak current control system allows the user to limit the peak input power consumption as seen by the power supply (e.g., battery supply). Such limiting may be performed by monitoring the operation state of the system in order to continually calculate the maximum allowable inductor current limit of a peak current controlled boost converter for purposes of: (1) protection against maximum supply consumption overloading which can produce a "brownout" condition on a portable device, (2) adjusting the boost converter's maximum allowable input power consumption for changes in the power supply capabilities so that maximum power can be delivered at higher battery charge states without adding risk at lower charge states, and/or (3) creating a "battery saving" mode which scales back power consumption in order to extend battery life under a low charge situation.

Continually monitoring the state of the power supply allows the system to automatically update the peak inductor current limit in order to take into account changes in the battery's power delivery capabilities. This continual updating allows a boost converter system, such as depicted in FIG. 3, to take advantage of the additional power delivery when available and scale back allowable consumption when the battery is in a weakened state.

From a user's standpoint, the dynamic peak current control is configured relative to the power supply restrictions desired for the end device. As used herein, the term "user" may broadly include not only an end user of a device including the dynamic peak current control, but also the designer, manufacturer, vendor, or other provider of the device who thus, in a sense, "uses" the dynamic peak current control and the boost converter system including dynamic peak current control in order to build the device. The dynamic peak current control may automatically monitor and/or manage appropriate variables in order not to violate the applicable supply power consumption limitations for the particular application via peak inductor current control. The exact responses and bounds to dynamic changes in the peak current limiting are intended to be user configurable and flexible for various applications.

Figure 3:
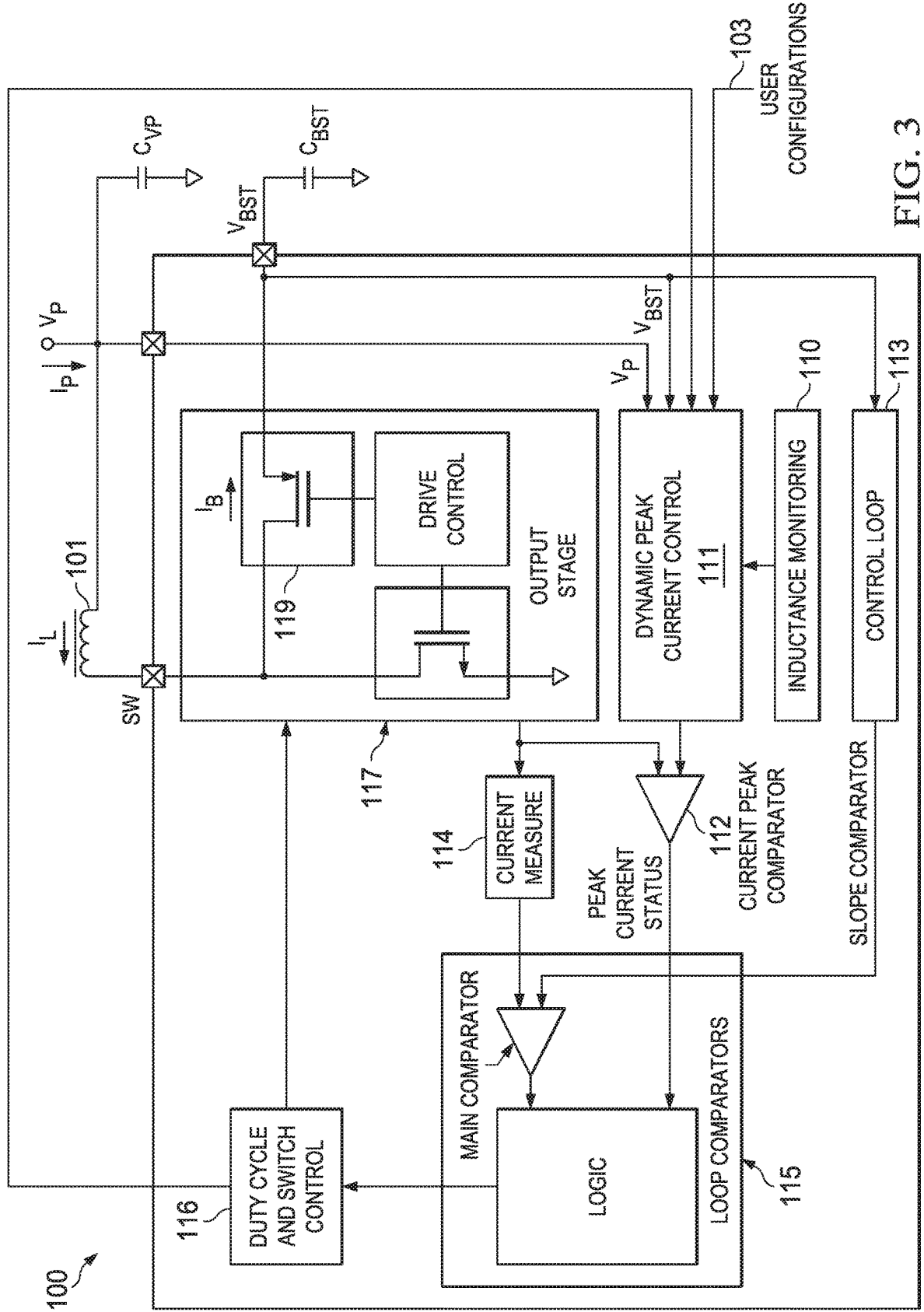
FIG. 3 illustrates a block diagram of an example boost converter system 8, in accordance with embodiments of the present disclosure.
Figure 4:
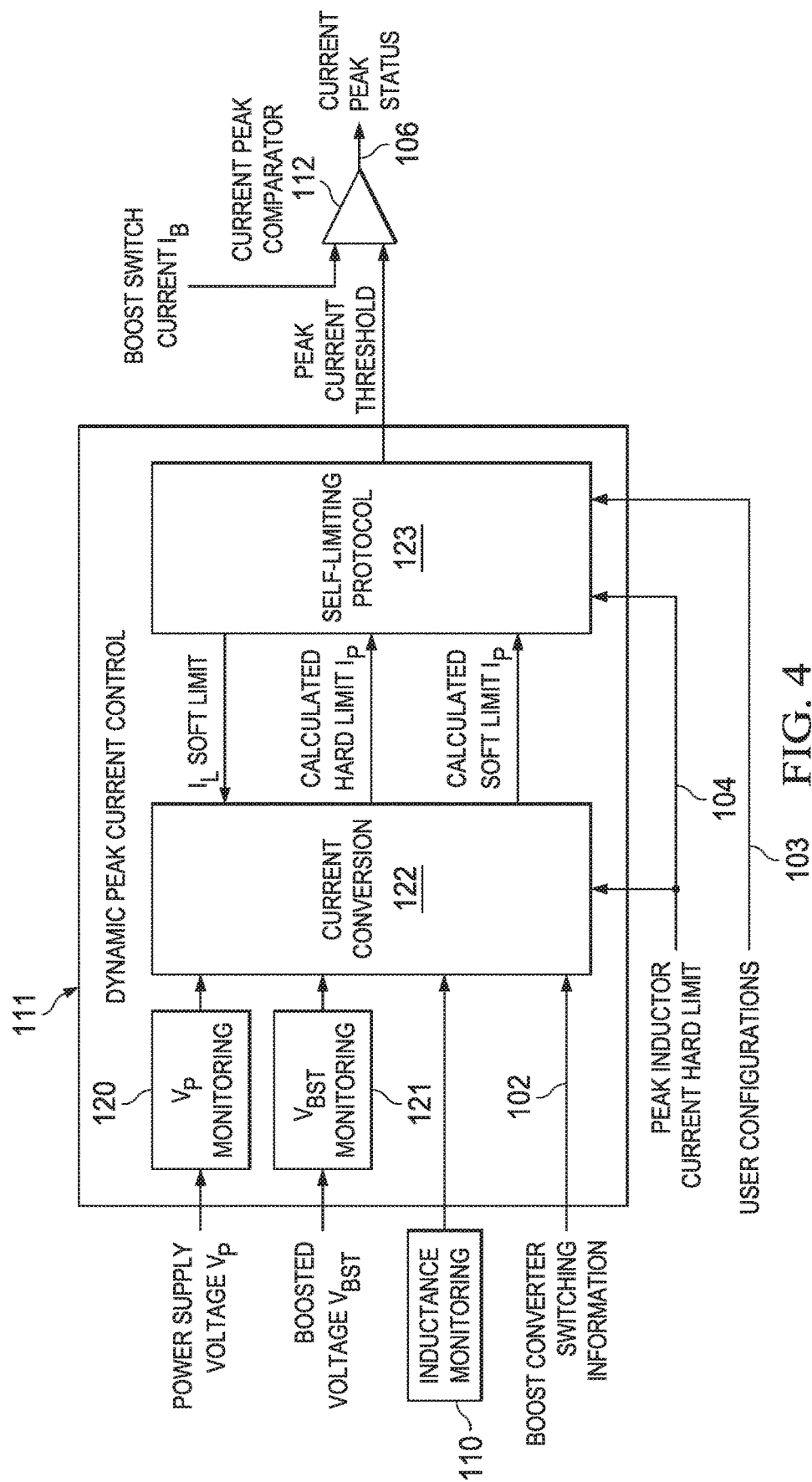
FIG. 4 illustrates a block diagram of an example dynamic peak current control 1 for use in boost converter system 8, in accordance with embodiments of the present disclosure.

FIG. 3 illustrates a block diagram of an example boost converter 100, in accordance with embodiments of the present disclosure. FIG. 4 illustrates a block diagram of an example dynamic peak current control 111 for use in boost converter 100, in accordance with embodiments of the present disclosure. As shown in FIG. 3 and FIG. 4, dynamic peak current control 111 may monitor power supply voltage $V_P$ (e.g., with $V_P$ monitoring 120, the operation of which is described in greater detail below) and boosted supply voltage $V_{BST}$ (e.g., with $V_{BST}$ monitoring 121, the operation of which is described in greater detail below), and may receive an inductance value $I_L$ from an inductance monitoring block 110 indicative of an inductance of inductor 101 of boost converter 100. Such information may be received via digital or analog signals. Dynamic peak current control 111 may also receive boost converter switching information 102 which may include (but is not limited to) a switching frequency of boost converter 100, a duty cycle of switches (e.g., within an output stage 117 of boost converter 100) of boost converter 100, the operational state of any edge (e.g., electromagnetic interference) control for such switches, a power efficiency of boost converter 100, and/or changes in impedance(s) of such switches that could impact a conversion of a peak inductor current $I_{LPEAK}$ to a power converter input current $I_P$. Such information may be provided to a current conversion block 122 in order to calculate an equivalent average power converter input current $I_P$ from a peak inductor current $I_{LPEAK}$. Such average power converter input current $I_P$ may then be supplied to a soft-limiting control 123, which may serve as a dynamic peak current control state machine.

Soft-limiting control 123 may compare the calculated average power converter input current $I_P$ with user configurations 103 in order to determine if a soft-limiting response is required. A peak inductor current soft limit may dynamically change as appropriate, but may always be of a lesser value than a static peak inductor current hard limit. If a soft-limiting response is required, the soft-limiting control 123 may calculate the necessary soft-limit in order to maintain desired operational conditions relative to the power supply, as set within user configurations 103 or other predefined configurations.

If no response is required, soft-limiting control 123 may pass a peak inductor current hard limit 104 to a peak current comparator 112 as a peak current threshold.

When triggered, peak current comparator 112 may communicate an appropriate signal to loop comparators 115, which may in turn signal a duty cycle and switch control 116 that boost switch 119 in output stage 117 must be deactivated (e.g., disabled, opened, turned off, etc.). Such boost switch deactivation may override normal boost converter regulation of a control loop 113. Once boost switch 119 is deactivated, inductor current $I_L$ may begin to decrease, limiting both peak inductor current $I_{LPEAK}$ and power converter input current $I_P$.

$V_P$ monitoring block 120 may report supply voltage $V_P$ measured via a dedicated sense pin local to a boosted amplifier device comprising boost converter 100, or in any other suitable manner in order to determine a voltage $V_P$ at or near an input of inductor 101. Power supply (e.g., battery) voltages may vary from platform to platform, across loading conditions, and across battery charge. Other subsystems of a device comprising boost converter 100 that share a power supply supplying supply voltage $V_P$ may also apply dynamic loading to the power supply. In addition, power supplies may have output impedances, and such dynamic loading may cause a raw supply voltage $V_P$ to continually change.

Figure 5:
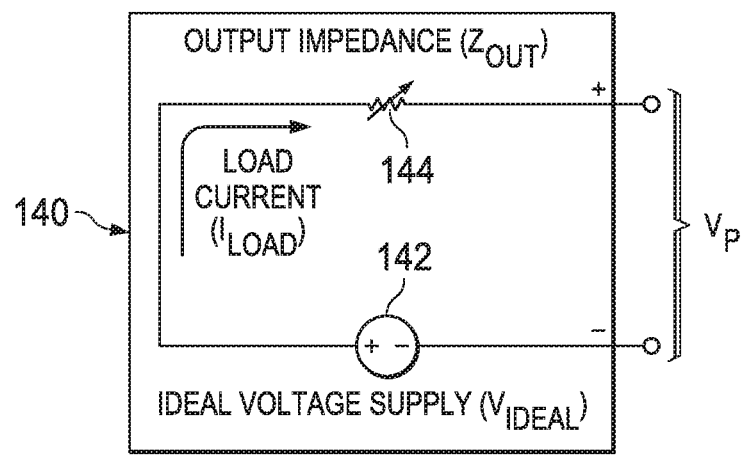
FIG. 5 is a circuit diagram of a model of an example battery which may be used as a power supply, in accordance with embodiments of the present disclosure.

To illustrate, FIG. 5 is a circuit diagram of a model 140 of an example battery which may be used as a power supply, in accordance with embodiments of the present disclosure. As shown in FIG. 5, a battery may be modeled as having an ideal voltage supply 142 outputting a voltage $V_{IDEAL}$ and an output impedance 144 with a variable impedance $Z_{OUT}$ which may vary due to change in the level of battery charge, discharge current, aging of the battery, and/or environmental effects. In operation, variable impedance $Z_{OUT}$ may vary due to change in level of battery charge. Thus, as current $I_{LOAD}$ delivered from a battery increases, the output voltage $V_P$ it generates may decrease. For example, if one assumes that a particular battery's output impedance ($Z_{OUT}$) is fixed at 0.3Ω, and it is not providing any current to a load (e.g., $I_{LOAD}$=0 A), and its ideal battery voltage $V_{IDEAL}$ is 3.6 V, then the battery's output voltage $V_P$ is equivalent to the ideal battery voltage ($V_P=V_{IDEAL}$=3.6 V). However, if the battery is providing 1 A of current $I_{LOAD}$ to a load, then output voltage $V_P$=(3.6 V)−(1 A)×(0.3Ω)=3.3 V. For a real (non-ideal) battery, $V_P$ may often be less than 3.3V.

As the supply voltage $V_P$ may continually change in both a slow, almost direct-current (DC)-like manner, and in a faster transient manner, in order to accurately convert peak inductor current $I_{LPEAK}$ to input supply current $I_P$, supply voltage $V_P$ must be continually monitored. From a state machine response standpoint of soft-limiting control 123, supply voltage $V_P$ may be compared against one or more thresholds in order to trigger a state machine response, or initiate the peak inductor current limiting to directly track supply voltage $V_P$ for purposes of adjusting the soft-limiting.

$V_{BST}$ Monitoring 121 may report boosted voltage $V_{BST}$ from boost converter 100. Depending on the architecture of boost converter 100, boosted voltage $V_{BST}$ may change based on regulation capabilities of boost converter 100. For example, in some boost converter architectures, poor alternating-current (AC) regulation may be acceptable. Others might track loading signal requirements, such as a Class-H boosted amplifier architecture. A boost converter may also enter a condition in which loss of regulation occurs under heavy load once a peak inductor current limit has been reached. Such condition may rapidly change boost voltage $V_{BST}$.

Inductance monitoring 110 may track an inductance of inductor 101. An actual inductance value may vary from part-to-part, vary across temperature, and/or vary under different heavy loading conditions. For example, actual inductances may vary by as much as 30% relative to a typical specified nominal inductance value. The actual inductance may have a dominant effect on a slope of a ripple current through inductor 101 and the ability to convert peak inductor current $I_{LPEAK}$ to supply current $I_P$. In order to minimize errors in converting peak inductor current $I_{LPEAK}$ to supply current $I_P$, the actual inductance of inductor 101 must be monitored to account for any variations and real time changes.

Current conversion block 122 may correlate a peak inductor current $I_{LPEAK}$ over to supply current $I_P$ for purposes of limiting supply power consumption by boost converter 100. Current conversion may be performed for both the soft limit from the soft-limiting control 123 and peak inductor current hard limit 104. Both the calculated hard limit and soft limit (relative to supply current $I_P$) may be provided to soft-limiting control 123.

For purposes of power management, supply current $I_P$ may be the reference current of most concern for leveraging a peak inductor current soft-limiting power management scheme. It is often supply current $I_P$ consumption, not the ripple of current inductor current $I_L$, which determines whether a portable device will "brownout."

Peak inductor current hard limit 104 may comprise a static limit which is configured by a user. Peak inductor current hard limit 104 may typically be set based on the current handling capabilities of inductor 101. Peak inductor current hard limit 104 may be configured to be the maximum peak inductor current $I_{LPEAK}$ which may be allowed during any point of operation.

Peak current comparator 112 may compare a boost switch current $I_B$ through boost switch 119 (which should be identical to inductor current $I_L$ when boost switch 119 is activated) with a pre-configured hard or soft limit, and when boost switch current $I_B$ exceeds the pre-configured (hard or soft) limit, the peak current comparator 112 may generate a signal to deactivate boost switch 119. Deactivating boost switch 119 once boost switch current $I_B$/inductor current $I_L$ has reached the peak current threshold may limit peak inductor current $I_{LPEAK}$ through inductor 101, and by extension, power consumption of boost converter 100 from the power supply.

The peak current threshold which is communicated to peak current comparator 112 may be based on either the static peak inductor current hard limit, or the dynamic peak inductor current soft limit. In some embodiments, the peak inductor current soft limit cannot exceed the hard limit set by the system. Typically, when the soft limit engages, it starts off with a threshold slightly less than the hard limit. When soft-limiting is no longer necessary, the threshold of peak current comparator 112 may return to the hard limit value.

User configurations 103 may allow a user to customize a response of dynamic peak current control 111 based on system level requirements. Such user configurations 103 may include, but are not limited to, a voltage response threshold(s), a number of voltage response thresholds, slope responses of each threshold, state machine response timings, $\Delta I_P/\Delta V_P$ relationships (e.g., how the soft current limit is controlled relative to the change in supply voltage $V_P$), a desired amount or limit on the amount of peak current limiting, and options for recovery once supply voltage $V_P$ has recovered.

As shown in FIG. 4, soft-limiting control 123 may receive user configurations 103, peak inductor current hard limit 104, and calculated hard limit input current $I_P$ and soft limit input current $I_P$ from the current conversion 122. From such information, soft-limiting control 123 may determine if peak inductor current $I_{LPEAK}$ needs to be reduced below the static hard limit to manage power consumption from the power supply of boost converter 100. If so, a peak inductor current soft limit may be calculated and output to peak current comparator 112, thereby reducing the maximum amount of inductor current $I_L$ allowed through boost switch 119. A single peak current limit threshold may be output from soft-limiting control 123 (within dynamic peak current control 111) to peak current comparator 112. Either the peak inductor current dynamic soft limit or static hard limit may be active at a given time. Accordingly, soft-limiting control 123 may manage the limiting to peak current comparator 112, thus allowing the use of a single peak current comparator 112 to be utilized for both hard-limiting and soft-limiting.

At least two different methods may be used to control input current $I_P$ through manipulation of peak inductor current limiting. A first method, referred to herein as "Method 1," may allow for a more gradual response and more immediate recovery. Method 1 may be used as both a transient response system and a battery saver system wherein reduction of input current $I_P$ is adjusted as a continual direct response to the changes in supply voltage $V_P$. A second method, referred to herein as "Method 2," may typically have a more immediate and aggressive response than that of Method 1 once it is triggered. Method 2 may be more specific to handling transient loading conditions and rapidly restricting input power consumption of boost converter 100 so that the power supply has a chance to recover and prevent from browning out a system comprising boost converter 100.

Based on a desired power management response, Method 1 and Method 2 can be used in conjunction with each other or in isolation. For example, in a portable, battery powered device where a battery can both slowly discharge, producing a reduction in supply voltage $V_P$, and where bursts of transient loading conditions can cause fast drops in supply voltage $V_P$, both of Method 1 and 2 may be desirable for use at the same time.

Method 1

Method 1 may track supply voltage $V_P$ and scale the maximum allowable current $I_P$ consumption along with supply voltage $V_P$. Method 1 may allow for single or multiple thresholds, with configurable response rates for change in maximum allowable current $I_P$ consumption with respect to changes in supply voltage $V_P$ (e.g., $\Delta I_P/\Delta V_P$) which can either be updated in real-time or in a delayed manner in order to prevent potential control loop oscillations. Such approach may allow dynamic peak current control 111 to increase or decrease the allowable peak input current $I_P$ consumption in order to scale supply voltage $V_P$ consumption based on power supply (e.g., battery) capabilities.

Figure 6:
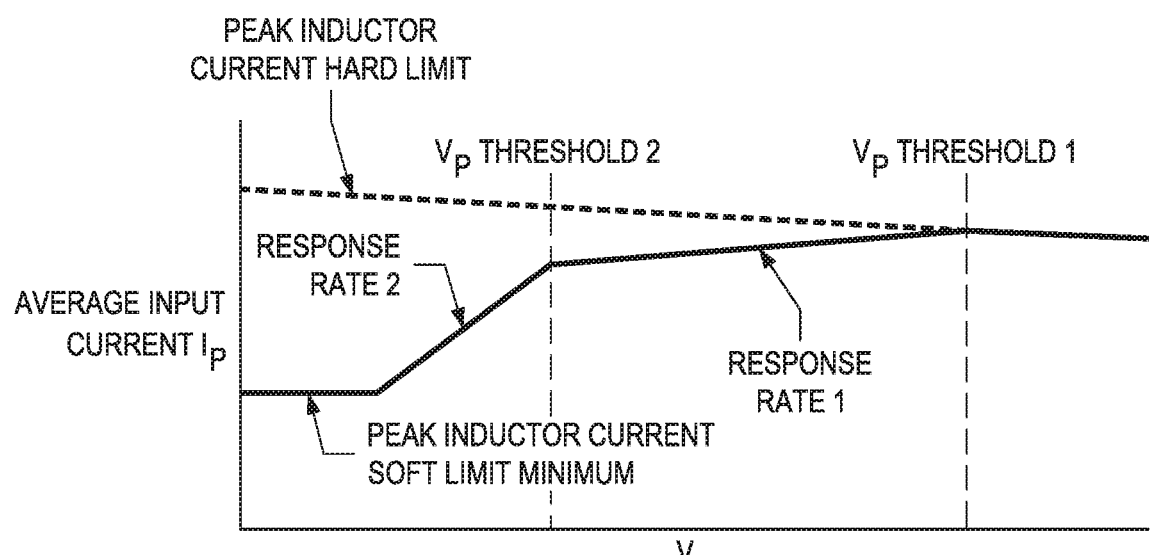
FIG. 6 depicts a graph of an average input current versus a supply voltage to illustrate an example of how a multi-threshold current-limiting approach with programmable response rates could respond with a varying supply voltage, in accordance with embodiments of the present disclosure.

Single or multiple thresholds may allow for a gradual initial phase of current limiting when the risk of overloading or browning out the system is low. A more aggressive response can be applied when the battery is in a weakened state and the system is in a state more vulnerable to overload or a system wide brownout. For example, FIG. 6 depicts a graph of average input current $I_P$ versus supply voltage $V_P$ to illustrate an example of how a multi-threshold approach with programmable response rates could respond with a varying supply voltage $V_P$, in accordance with embodiments of the present disclosure. This example assumes other variables, such as inductance of inductor 101, boosted voltage $V_{BST}$, and a load of the power supply, remain constant. As shown in FIG. 6, an absolute minimum may also be applied to the inductor current soft-limiting performed by soft-limiting control 123. Once this absolute minimum value has been reached, a response rate relationship (e.g., Response Rate 2 shown in FIG. 6) between supply voltage $V_P$ and the current limiting may become further limited by the configured soft-limiting minimum.

Figure 7:
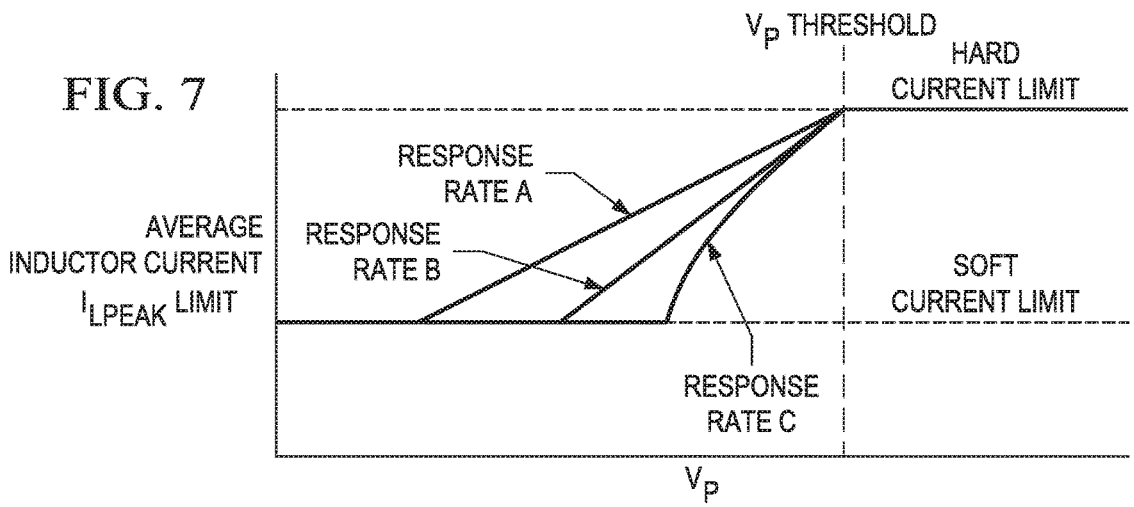
FIG. 7 depicts a graph of a peak inductor current limit versus a supply voltage to illustrate how a user may configure various response rates in order to customize a soft-limiting response based on system power to a system comprising a boost converter, in accordance with embodiments of the present disclosure.

FIG. 7 depicts a graph of peak inductor current $I_{LPEAK}$ limit versus supply voltage $V_P$ to illustrate how a user may configure various response rates in order to customize the soft-limiting response based on system power to a system comprising boost converter 100 and how it might correspond to limiting of the peak inductor current, in accordance with embodiments of the present disclosure. The peak inductor current limit response rates may be linear or non-linear based on a combination of the user's configuration when tracking the response to the drop in supply voltage $V_P$ and changes to the inductor current $I_L$ and input current $I_P$ relationship.

Figure 8:
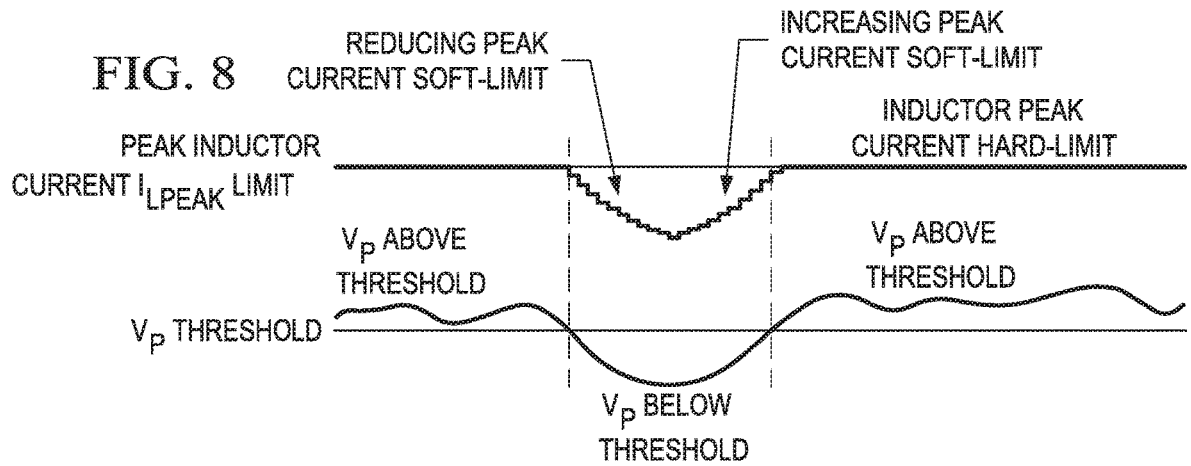
FIG. 8 depicts a graph of a peak inductor current limit and a supply voltage $V_P$ over time to illustrate how a single-threshold linear response could track a supply voltage transient waveform in order to reduce input current consumption as supply voltage decreases, in accordance with embodiments of the present disclosure.

FIG. 8 depicts a graph of peak inductor current $I_{LPEAK}$ limit and supply voltage $V_P$ over time to illustrate how a single-threshold linear response could track a supply voltage $V_P$ transient waveform in order to reduce input current consumption as supply voltage $V_P$ decreases in order to prevent a system comprising boost converter 100 from browning out due to pulling more current from the power supply than the power supply is able to provide, in accordance with embodiments of the present disclosure. Prior to supply voltage $V_P$ decreasing below a $V_P$ threshold, the peak inductor current limit may reside at a peak inductor current hard-limit. After supply voltage $V_P$ decreases back above the $V_P$ threshold again and the soft-limiting has had a chance to catch up to the change in supply voltage $V_P$, peak inductor current $I_{LPEAK}$ may return to the hard-limit in order to allow for maximum power delivery for boost converter 100.

Method 2

Method 2 may comprise a triggered time-based system in which a combination of timers, user configurable response step sizes, and threshold(s) may be utilized to determine a response. Instead of tracking supply voltage $V_P$ directly with a $\Delta I_P/\Delta V_P$ approach once a threshold supply voltage $V_P$ has been violated, Method 2 may employ an attacking state in which a peak inductor current soft-limit is reduced at a configurable rate in response to a voltage transient in supply voltage $V_P$. Thus, Method 2 is intended to prevent a large amount of current to be consumed which may otherwise risk an overload or a brownout condition.

Method 2 may be designed to intentionally overreact from a soft-limiting standpoint in order to reduce input current $I_P$ consumption as quickly as possible and allow for a fast recovery for supply voltage $V_P$. As discussed in the Background section, a distributed capacitance may appear at the output of the power supply. Such capacitance may take some time to recharge after a heavy loading event has occurred. Thus, reducing the allowable power consumption of boost converter 100 in a quick and aggressive manner may allow supply voltage $V_P$ to more quickly recover and may reduce the potential of a brownout event on the end device.

Figure 9:
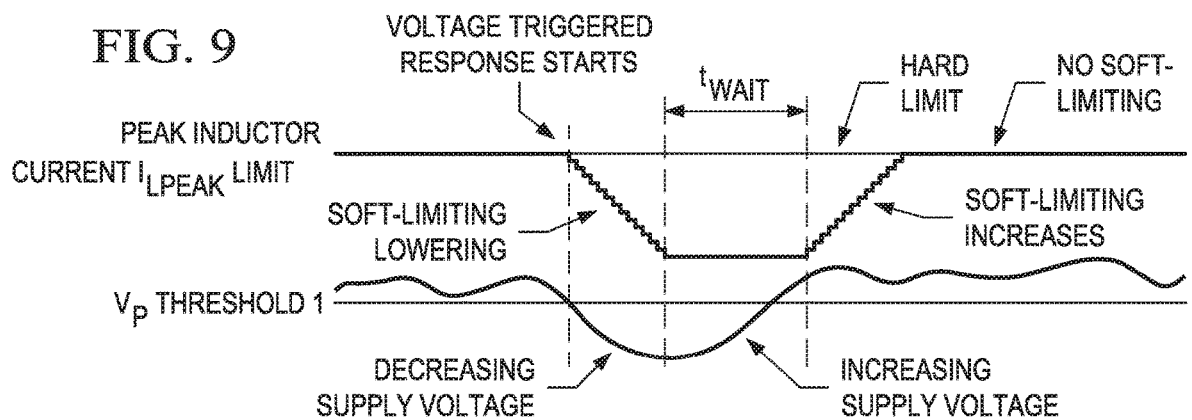
FIG. 9 depicts a graph of a peak inductor current limit and supply voltage over time to illustrate an example implementation of a peak inductor current limiting time-based response, in accordance with embodiments of the present disclosure.

FIG. 9 depicts a graph of peak inductor current $I_{LPEAK}$ limit and supply voltage $V_P$ over time to illustrate an example implementation of a peak inductor current limiting time-based response, in accordance with embodiments of the present disclosure. As shown in FIG. 9, when supply voltage $V_P$ falls below a first threshold $V_P$ Threshold 1, peak current soft-limiting may be triggered and soft-limiting control 123 may begin to reduce the limit of peak inductor current $I_{LPEAK}$. As long as supply voltage $V_P$ remains below $V_P$ Threshold 1 and continues to decrease, the limit of peak inductor current $I_{LPEAK}$ may continue to be reduced.

Once supply voltage $V_P$ stops decreasing, soft-limiting control 123 may remain static for a configurable period of time $t_{WAIT}$. Once this period of time has expired, the soft-limiting of soft-limiting control 123 may begin to release, and soft-limiting control 123 may increase the peak inductor current soft limit until it either reaches the hard limit, supply voltage $V_P$ remains below $V_P$ Threshold 1 and starts to decrease again, or supply voltage $V_P$ returns above $V_P$ Threshold 1 and then at a later point in time decreases back below $V_P$ Threshold 1, at which time soft-limiting control 123 may reduce the maximum allowable peak current again via the dynamic soft limit. Waiting for the supply voltage $V_P$ to start increasing allows for an aggressive response when a low supply voltage condition first occurs, but produces a quick recovery of allowable power through boost converter 100 as soon as the supply voltage $V_P$ shows signs of recovery in order to minimize the total amount of time in which power delivery to boost converter 100 is impacted.

FIG. 10 depicts a graph of peak inductor current $I_{LPEAK}$ limit and supply voltage $V_P$ over time to illustrate an example implementation in which a peak current soft-limit is continually reduced until the supply voltage $V_P$ has returned above an initial triggering threshold of a peak inductor current limiting time-based response, in accordance with embodiments of the present disclosure. This continual reduction may rapidly drive down input current $I_P$ consumption for an extended period of time in order to allow the supply voltage $V_P$ to recover. This example implementation is more heavily weighted towards ensuring recovery of supply voltage $V_P$ than minimizing the impact on power delivery to boost converter 100. Due to the longer period of time where the soft limit is actively being reduced, the minimum soft-limit value may be lower and may take longer to return to normal operation than the example implementation of FIG. 9.

FIG. 11 depicts a graph of peak inductor current $I_{LPEAK}$ limit and supply voltage $V_P$ over time to illustrate an example implementation utilizing a multi-threshold response wherein as supply voltage $V_P$ decreases below each threshold, a different response rate is applied for each threshold, in accordance with embodiments of the present disclosure. A plurality of thresholds (e.g., $V_P$ Threshold 1, $V_P$ Threshold 2, and $V_P$ Threshold 3) may correspond to different user configurable levels such that when supply voltage $V_P$ decreases below each such threshold, a different response (e.g., Response 1, Response 2, Response 3) is triggered. For purposes of this example, Response 1, Response 2, and Response 3 may comprise different step reductions with a fixed time rate. Such response steps may become progressively more aggressive as the peak current limiting progresses from Response 1 to Response 3. Such multi-threshold response may be performed to minimize the reduction of peak inductor current soft-limiting for smaller decreases in supply voltage $V_P$, while automatically scaling up the response step sizes to respond when a larger decrease occurs in supply voltage $V_P$. In a time based soft-limiting approach, the implementation of FIG. 11 may have the benefit of reducing overreactions for small, transient decreases of supply voltage $V_P$, while still allowing a large power restriction for more severe decreases of supply voltage $V_P$.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A method comprising:
   monitoring an input power supply voltage of a power supply;
   monitoring an inductance of an inductor of a boost converter comprising the inductor;
   monitoring one or more other characteristics of the boost converter;
   calculating a target peak inductor current based on the input power supply voltage, the inductance, the one or more other characteristics of the boost converter, and a target average current of the inductor during a switching cycle of the boost converter; and
   reducing the target peak inductor current in a controllable manner and ceasing regulation of an output voltage of the boost converter responsive to the input power supply voltage falling below a threshold voltage.

2. The method of claim 1, further comprising controlling an average current of the inductor by regulating a peak inductor current of the inductor in accordance with a maximum average inductor current during a switching cycle.

3. The method of claim 1, wherein the one or more characteristics comprise a duty cycle for switching of a switch of the boost converter.

4. The method of claim 1, wherein the one or more characteristics comprise an output voltage of the boost converter.

5. The method of claim 1, wherein the one or more characteristics comprise an output current of the boost converter.

6. The method of claim 1, wherein the one or more characteristics comprise a power efficiency of the boost converter.

7. The method of claim 1, further comprising deactivating a switch of the boost converter in response to an instantaneous inductor current of the inductor exceeding the target peak inductor current.

8. The method of claim 1, further comprising controlling an instantaneous inductor current and the target peak inductor current based on a user configuration.

9. The method of claim 8, wherein the user configuration comprises at least one of a voltage response threshold, a slope response of a voltage response threshold, state machine response timings, changes of supply current with respect to input power supply voltage, a desired limit of the target peak inductor current, and recovery options in response to recovery of the power supply.

10. The method of claim 1, wherein the controllable manner scales the target peak inductor current to changes in the input power supply voltage in accordance with configurable response rates for a change in target peak inductor current with respect to a change in input power supply voltage.

11. The method of claim 1, wherein the controllable manner reduces the target peak inductor current at a configurable rate in response to a voltage transient in the input power supply voltage.

12. An apparatus comprising:
    a boost converter having a power supply input for receiving an input power supply voltage of a power supply, an inductor, and an output for generating an output voltage greater than the input power supply voltage; and
    a controller configured to:
      monitor the input power supply voltage;
      monitor the inductance of the inductor;
      monitor one or more other characteristics of the boost converter;
      calculate a target peak inductor current based on the input power supply voltage, the inductance, the one or more other characteristics of the boost converter, and a target average current of the inductor during a switching cycle of the boost converter; and
      reduce the target peak inductor current in a controllable manner and cease regulation of the output voltage of the boost converter responsive to the input power supply voltage falling below a threshold voltage.

13. The apparatus of claim 12, wherein the controller is further configured to control an average current of the inductor by regulating a peak inductor current of the inductor in accordance with a maximum average inductor current during a switching cycle.

14. The apparatus of claim 12, wherein the one or more characteristics comprise a duty cycle for switching of a switch of the boost converter.

15. The apparatus of claim 12, wherein the one or more characteristics comprise the output voltage.

16. The apparatus of claim 12, wherein the one or more characteristics comprise an output current of the boost converter.

17. The apparatus of claim 12, wherein the one or more characteristics comprise a power efficiency of the boost converter.

18. The apparatus of claim 12, wherein the controller is further configured to deactivate a switch of the boost converter in response to an instantaneous inductor current of the inductor exceeding the target peak inductor current.

19. The apparatus of claim 12, wherein the controller is further configured to control an instantaneous inductor current and the target peak inductor current based on a user configuration.

20. The apparatus of claim 19, wherein the user configuration comprises at least one of a voltage response threshold, a slope response of a voltage response threshold, state machine response timings, changes of supply current with respect to input power supply voltage, a desired limit of the target peak inductor current, and recovery options in response to recovery of the power supply.

21. The apparatus of claim 12, wherein the controllable manner scales the target peak inductor current to changes in the input power supply voltage in accordance with configurable response rates for a change in target peak inductor current with respect to a change in input power supply voltage.

22. The apparatus of claim 12, wherein the controllable manner reduces the target peak inductor current at a configurable rate in response to a voltage transient in the input power supply voltage.

23. A method comprising:
monitoring an input power supply voltage of a power supply;
monitoring an inductance of an inductor of a boost converter comprising the inductor;
monitoring one or more other characteristics of the boost converter;
calculating an average current of the inductor during a switching cycle of the boost converter based on the input power supply voltage, the inductance, the one or more other characteristics of the boost converter, and a peak inductor current of the inductor; and
reducing the average current in a controllable manner and ceasing regulation of an output voltage of the boost converter responsive to the input power supply voltage falling below a threshold voltage.

24. The method of claim 23, further comprising controlling the peak inductor current of the inductor by regulating the average current of the inductor in accordance with a maximum peak inductor current during a switching cycle.

25. The method of claim 23, wherein the one or more characteristics comprise a duty cycle for switching of a switch of the boost converter.

26. The method of claim 23, wherein the one or more characteristics comprise an output voltage of the boost converter.

27. The method of claim 23, wherein the one or more characteristics comprise an output current of the boost converter.

28. The method of claim 23, wherein the one or more characteristics comprise a power efficiency of the boost converter.

29. The method of claim 23, wherein the controllable manner scales the average current to changes in the input power supply voltage in accordance with configurable response rates for a change in target peak inductor current with respect to a change in input power supply voltage.

30. The method of claim 23, wherein the controllable manner reduces the average current at a configurable rate in response to a voltage transient in the input power supply voltage.

31. An apparatus comprising:
a boost converter having a power supply input for receiving an input power supply voltage of a power supply, an inductor, and an output for generating an output voltage greater than the input power supply voltage; and
a controller configured to:
monitor the input power supply voltage;
monitor the inductance of the inductor;
monitor one or more other characteristics of the boost converter;
calculate an average current of the inductor during a switching cycle of the boost converter based on the input power supply voltage, the inductance, the one or more other characteristics of the boost converter, and a peak inductor current of the inductor; and
reduce average current in a controllable manner and cease regulation of the output voltage of the boost converter responsive to the input power supply voltage falling below a threshold voltage.

32. The apparatus of claim 31, wherein the controller is further configured to control the peak inductor current of the inductor by regulating the average current of the inductor in accordance with a maximum peak inductor current during a switching cycle.

33. The apparatus of claim 31, wherein the one or more characteristics comprise a duty cycle for switching of a switch of the boost converter.

34. The apparatus of claim 31, wherein the one or more characteristics comprise an output voltage of the boost converter.

35. The apparatus of claim 31, wherein the one or more characteristics comprise an output current of the boost converter.

36. The apparatus of claim 31, wherein the one or more characteristics comprise a power efficiency of the boost converter.

37. The apparatus of claim 31, wherein the controllable manner scales the average current to changes in the input power supply voltage in accordance with configurable response rates for a change in target peak inductor current with respect to a change in input power supply voltage.

38. The apparatus of claim 31, wherein the controllable manner reduces the average current at a configurable rate in response to a voltage transient in the input power supply voltage.

* * * * *